(12) United States Patent
Mariner et al.

(10) Patent No.: US 7,259,358 B2
(45) Date of Patent: Aug. 21, 2007

(54) ENCAPSULATED GRAPHITE HEATER AND PROCESS

(75) Inventors: John T. Mariner, Avon Lake, OH (US); Timothy Hejl, Independence, OH (US)

(73) Assignee: General Electric Company, Pittsfield, MA (US)

( * ) Notice: Subject to any disclaimer, the term of this patent is extended or adjusted under 35 U.S.C. 154(b) by 369 days.

(21) Appl. No.: 10/687,212

(22) Filed: Oct. 16, 2003

(65) Prior Publication Data
US 2004/0074899 A1 Apr. 22, 2004

Related U.S. Application Data

(63) Continuation-in-part of application No. 10/277,786, filed on Oct. 21, 2002.

(51) Int. Cl.
*H05B 3/68* (2006.01)
*C23C 14/00* (2006.01)
(52) U.S. Cl. ..................... 219/444.1; 392/389
(58) Field of Classification Search ............. 219/444.1, 219/543, 544, 546, 547, 548; 392/386, 387, 392/388, 389; 29/610.1, 611, 620; 427/271, 427/272, 277, 282, 383.1, 383.3, 383.5
See application file for complete search history.

(56) References Cited

U.S. PATENT DOCUMENTS

| | | | | |
|---|---|---|---|---|
| 4,263,528 A | * | 4/1981 | Miram | 313/293 |
| 4,264,803 A | | 4/1981 | Julius | 392/389 |
| 5,031,229 A | | 7/1991 | Chow | 392/389 |
| 5,343,022 A | | 8/1994 | Gilbert et al. | 219/552 |
| 5,882,730 A | * | 3/1999 | Kimura et al. | 427/271 |
| 5,977,526 A | | 11/1999 | Terry et al. | 219/552 |
| 6,140,624 A | | 10/2000 | Gilbert | 219/553 |
| 6,242,719 B1 | * | 6/2001 | Kano et al. | 219/444.1 |
| 6,410,172 B1 | | 6/2002 | Gilbert | 628/408 |

* cited by examiner

Primary Examiner—Sang Paik

(57) ABSTRACT

A graphite heater and method of forming a graphite heater comprising a graphite body configured to form an electrical heating circuit for at least one heating zone through the graphite encapsulated in a continuous overcoat layer comprising at least one of a nitride, carbide, carbonitride or oxynitride of elements selected from a group consisting of B, Al, Si, Ga, refractory hard metals, transition metals, and rare earth metals, or complexes and/or combinations thereof, wherein prior to being configured to form the electrical heating circuit path, the graphite body is coated with a layer comprising at least one of a nitride, carbide, carbonitride or oxynitride of elements selected from a group consisting of B, Al, Si, Ga, refractory hard metals, transition metals, and rare earth metals, or complexes and/or combinations thereof.

22 Claims, 2 Drawing Sheets

US 7,259,358 B2

ENCAPSULATED GRAPHITE HEATER AND PROCESS

CROSS-REFERENCE TO RELATED APPLICATIONS

This patent application is a cont-in-part of U.S. application Ser. No. 10/277,786 with a filing date of Oct. 21, 2002.

FIELD OF INVENTION

The present invention relates to a heating device primarily for use in semiconductor wafer processing equipment.

BACKGROUND OF THE INVENTION

In the fabrication of a semiconductor device or semiconductor material, a semiconductor wafer is processed in an enclosure defining a reaction chamber at a relatively high temperature above 1000° C., with the wafer being placed adjacent to or in contact with a resistive heater coupled to a power source. In this process, the temperature of the semiconductor wafer is held substantially constant and uniform, varying in the range of about 1° C. to 10° C.

U.S. Pat. No. 5,343,022 discloses a heating unit for use in a semiconductor wafer processing process, comprising a heating element of pyrolytic graphite ("PG") superimposed on a pyrolytic boron nitride base. The graphite layer is machined into a spiral or serpentine configuration defining the area to be heated, with two ends connected to a source of external power. The entire heating assembly is then coated with a pyrolytic boron nitride ("pBN") layer. U.S. Patent No. 2002-06-25 discloses a heating element, wafer carrier, or electrostatic chuck comprising a PG element mounted on a pBN substrate, with the entire assembly being subsequently CVD coated with an outer coating of AlN to protect the assembly from chemical attacks.

Although graphite is a refractory material which is economical and temperature resistant, graphite is corroded by some of the wafer processing chemical environments, and it is prone to particle and dust generation. Due to the discontinuous surface of a conventionally machined graphite heater, the power density varies dramatically across the area to be heated. Moreover, a graphite body particularly after machining into a serpentine geometry is fragile and its mechanical integrity is poor. Accordingly, even with a relatively large cross sectional thickness, e.g., above about 0.1 inches as typical for semiconductor graphite heater applications, The heater is still extremely weak and must be handled with care. Furthermore, a graphite heater changes dimension over time due to annealing which induces bowing or misalignment, resulting in an electrical short circuit. Additionally, it is also conventional in semiconductor wafer processing to deposit a film on the semiconductor which may be electrically conductive, such films may deposit as fugitive coatings on The heater which can also contribute to an electrical short circuit, a change in electrical properties, or induce additional bowing and distortion.

Applicants have discovered an improved heater formed from a solid graphite body, which overcomes the inherent fragility and weakness of the prior art heater while still retaining inherent refractory properties of graphite.

SUMMARY OF THE INVENTION

The invention relates to a resistive heater comprising an encapsulated solid graphite body, wherein the encapsulant forms a substantially continuous surface coating the graphite body and wherein the encapsulant is selected from a nitride, carbide, carbonitride or oxynitride of elements selected from a group consisting of B, Al, Si, Ga, refractory hard metals, transition metals, and rare earth metals, or complexes and/or combinations thereof. In one embodiment, the encapsulant is a thin shell of a chemical vapor deposited (CVD) material such as pyrolytic boron nitride (pBN) or aluminum nitride (AlN).

The invention also relates to a resistive heating element comprising a solid graphite body encapsulated by a CVD deposited material, the graphite body is configured in a spiral or serpentine geometrical shape defining at least one zone of an electrical heating circuit, having opposed ends so as to provide an electrical path for at least a heating zone through the graphite body.

The invention further relates to a method for forming a graphite heater from a solid body composed of graphite, the method comprises the steps of: a) coating a graphite body with a overcoat layer of a nitride, carbide, carbonitride or oxynitride of elements selected from a group consisting of B, Al, Si, Ga, refractory hard metals, transition metals, and rare earth metals, or complexes and/or combinations thereof; b) forming an electrical circuit pattern formed in the graphite body with opposed ends adapted for connection to an external power supply; and c) encapsulating the patterned graphite body with at least an outer coat layer of nitride, a carbonitride or an oxynitride of elements selected from a group consisting of B, Al, Si, Ga, refractory hard metals, transition metals, and rare earth metals, forming an electrically insulating thin film shell surrounding the heater assembly.

BRIEF DESCRIPTION OF THE DRAWINGS

FIGS. 2(a), 2(b), 2(c), 2(d), and 2(e) illustrate one embodiment of the process of the invention wherein the graphite body is not fully encapsulated as in the process of FIGS. 1(a)–1(e).

DETAILED DESCRIPTION OF THE INVENTION

Applicants have discovered a novel heater and a novel process to fabricate a heater comprising a patterned graphite body, coated with a substantially continuous overcoat layer or layers of nitride, carbide, carbonitride or oxynitride to form a single structurally integral unit, which is more stable than The heater of the prior art. We now describe various embodiments of the processes to fabricate the resistive heater of the invention, which is also illustrated in FIGS. 1A–1E and FIGS. 2A–2E.

Providing a Coated Pyrolytic Graphite Base: The base of the heater of the invention is a solid graphite body; either conventional graphite or pyrolytic graphite. Pyrolytic graphite is essentially highly oriented polycrystalline graphite produced by high temperature pyrolysis of a hydrocarbon gas such as methane, ethane, ethylene, natural gas, acetylene and propane.

Figure 1A:
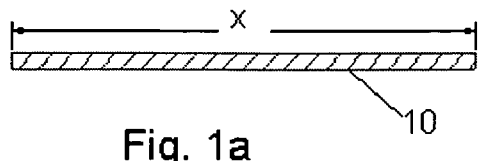
FIGS. 1(a), 2(b), 2(c), 2(d) and 2(e) illustrate one embodiment of the process of the invention, a stage progression of steps for fabricating the heater having a solid graphite body.
Figure 2A:
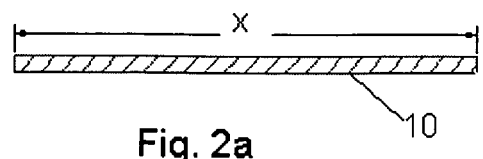

In one embodiment of the invention, a solid graphite body is machined into a base 10. The base may be of any general heater shape, including a rectangular or round disk shape geometry (as shown in FIG. 1A) with at least a continuous surface.

Figure 4A:
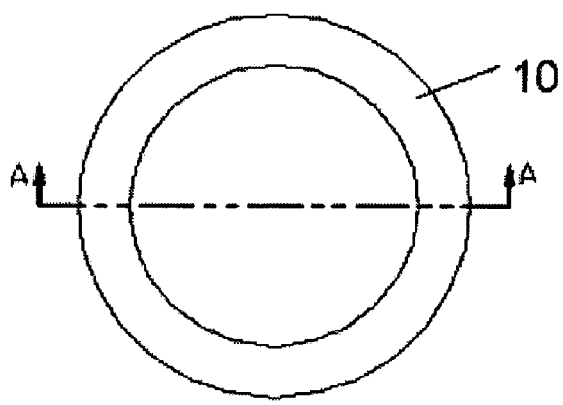
FIGS. 4(a), 4(b), and 4(c) are plan views of another embodiment of the invention, for a heater formed from a graphite cylinder.
Figure 4B:
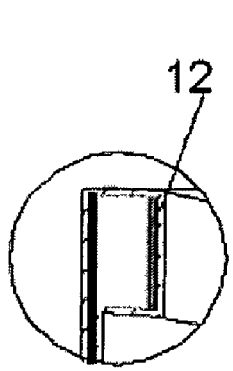
Figure 4C:
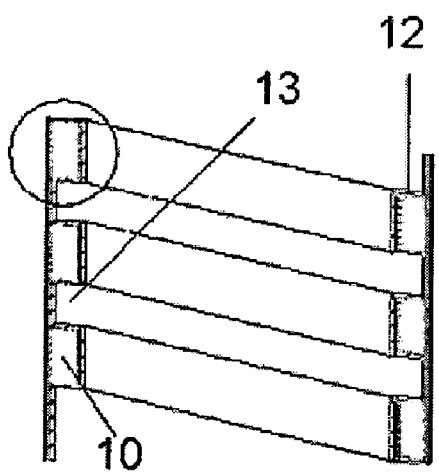

In another embodiment of the invention, the solid graphite body is of a cylinder shape as shown in FIGS. 4A–4C, with an inside diameter, an outside diameter, and a length, and that the wall thickness of the cylinder is machined into a predetermined path, e.g., a serpentine or helical pattern. FIG. 4A represents a top view of the heater having a cylindrical shape. FIG. 4B shows the cylindrical heater in cross section taken along the lines A—A of FIG. 4A, and FIG. 4C represents an exploded view of the encircled area shown in FIG. 4B. The body or base 10 can be of any desired thickness (d) suitable for semiconductor processing applications.

The thickness of the graphite form may be determined from electrical calculations on the finished part. Fundamental calculations for the finished heater electrical resistance are known in the art, i.e., based on the length, the width, and the thickness of the serpentine electrical path, with the thickness of the electrical path being designed in to the graphite base 10. In one embodiment for use in a semiconductor wafer process, the graphite base 10 has a thickness of at least 0.05 inches. In a second embodiment, the graphite base 10 is in the form of a disk having a thickness of at least about 0.10 inches.

Figure 1B:
Figure 2B:
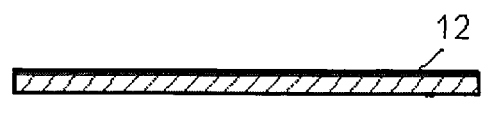

In the next step, the graphite base 10 is provided with at least a substantially continuous coating layer 12 of a sufficient thickness to provide the desired corrosion resistance as well as structural integrity and support in the machining step. In one embodiment as illustrated in FIG. 1B, the coating layer 12 encapsulates both the top and bottom surfaces of the graphite base body 10. In another embodiment of the process of the invention as illustrated in FIG. 2B, the coating layer 12 simply covers the top surface of the graphite base body 10 for corrosion resistance and structural support.

In one embodiment, the coating layer has a thickness of 0.005 to 0.10 inches. In a second embodiment, this coating layer is about 0.01 to 0.05 inches. In a third embodiment, the coating layer has a thickness of less than about 0.02 inches. In yet a fourth embodiment, the coating layer is a flat solid substantially continuous surface layer of pBN having a thickness in the range of about 0.01–0.03 inches.

The coating layer of the graphite body comprises at least one of a nitride, carbide, carbonitride or oxynitride of elements selected from a group consisting of B, Al, Si, Ga, refractory hard metals, transition metals, and rare earth metals, or complexes and/or combinations thereof. Examples include pyrolytic boron nitride, aluminum nitride, titanium aluminum nitride, titanium nitride, titanium aluminum carbonitride, titanium carbide, silicon carbide, and silicon nitride.

In a one embodiment, the coating layer comprises pBN. In a second embodiment, the layer comprises AlN. In a third embodiment, a complex of AlN and BN. In a fourth embodiment, the coating layer comprises a composition of pyrolytic boron nitride (PBN) and a carbon dopant in an amount of less than about 3 wt % such that its electrical resistivity is smaller than $10^{14}$ Ω-cm. In yet a fifth embodiment, the coating layer comprises an aluminum nitride wherein a small amount of $Y_2O_3$ is added, e.g. in amount of 5 wt % relative to 100 wt % of aluminum nitride. Both pBN and AlN have excellent insulating and conducting properties and can be easily deposited from the gaseous phase. They also have a high temperature stability. Additionally, they have a different color (white) than the pyrolytic graphite base (black) such that in the step of forming the electrical patterns, the coating layer can be easily visually distinguished from the patterns.

Different methods can be used to deposit the coating layer or layers onto the graphite body/substrate. In one embodiment, at least one of the layers can be applied through physical vapor deposition (PVC), wherein the coating material, e.g. boron nitride and/or aluminum nitride is/are transferred in vacuum into the gaseous phase through purely physical methods and are deposited on the surface to be coated. A number method variants can be used. In one embodiment, the coating material is deposited onto the surface under high vacuum, wherein it is heated to transition either from the solid via the liquid into the gaseous state or directly from the solid into the gaseous state using electric resistance heating, electron or laser bombardment, electric arc evaporation or the like. Sputtering can also be used, wherein a solid target which consists of the respective coating material is atomized in vacuum by high-energy ions, e.g. inert gas ions, in particular argon ions, with the ion source being e.g. an inert gas plasma. Finally, a target which consists of the respective coating material can also be bombarded with ion beams under vacuum, be transferred into the gaseous phase and be deposited on the surface to be coated.

Of course, the above-mentioned PVD methods can also be combined and at least one of the layers can be deposited e.g. through plasma-supported vapor deposition.

Alternatively in one embodiment of the invention or as an additional coating layer, one of the layers can be deposited through chemical vapor deposition (CVD). In contrast to the PVD methods, the CVD method has associated chemical reactions. The gaseous components produced at temperatures of approximately 200 to 2000° C. through thermal, plasma, photon or laser-activated chemical vapor deposition are transferred with an inert carrier gas, e.g. argon, usually at under-pressure, into a reaction chamber in which the chemical reaction takes place. The solid components thereby formed are deposited onto the graphite body to be coated. The volatile reaction products are exhausted along with the carrier gas.

In one embodiment of the invention, the graphite body 10 is coated with a layer of pyrolytic boron nitride via a CVD process as described in U.S. Pat. No. 3,182,006, the disclosure of which is herein incorporated by reference. In the process, vapors of ammonia and a gaseous boron halide such as boron trichloride ($BCl_3$) in a suitable ratio are used to form a boron nitride deposit on the surface of the graphite base 10.

In yet another embodiment of the invention, at least one of the layers can also be deposited using thermal injection methods, e.g. by means of a plasma injection method. Therein, a fixed target is heated and transferred into the gaseous phase by means of a plasma burner through application of a high-frequency electromagnetic field and associated ionization of a gas, e.g. air, oxygen, nitrogen, hydrogen, inert gases etc. The target may consist, e.g. of boron nitride or aluminum nitride and be transferred into the gaseous phase and deposited on the graphite body to be coated in a purely physical fashion. The target can also consist of boron and be deposited as boron nitride on the surface to be coated through reaction with the ionized gas, e.g., nitrogen.

In another embodiment, a thermal spray process is used, i.e., a flame spray technique is used wherein the powder coating feedstock is melted by means of a combustion flame, usually through ignition of gas mixtures of oxygen and another gas. In another thermal spray process called arc plasma spraying, a DC electric arc creates an ionized gas (a plasma) that is used to spray the molten powdered coating materials in a manner similar to spraying paint. In yet another embodiment, the coating material is applied as a paint/spray and sprayed onto the graphite body with an air sprayer.

In another embodiment for a relatively "thick" coating layer, i.e., of 0.03 inches or thicker, the coating material is applied simply as a liquid paint and then dried at sufficiently high temperatures to dry out the coating. In one embodiment wherein BN is used as a coating, the BN over-coated graphite structure is dried at a temperature of at least 75° C., and in one embodiment, of at least 100° C. to dry out the coating.

In one embodiment of the invention and after a coating process as described above, the coated graphite structure is heated to a temperature of at least 500° C. to further bond the nitride coating onto the graphite body.

Forming Electrical Patterns on the Coated Graphite Base: The forming of an electrical pattern in the solid graphite body, i.e., an electrically isolated, resistive heater path may be done by techniques known in the art, including but not limited to micro machining, micro-brading, laser cutting, chemical etching, or e-beam etching. The pattern may be defined for example, by a removable mask or tape. Other masking techniques include the use of dissolvable protective coatings, e.g., photoresist. Patterned application allows for controlled heating in localized areas of the graphite body.

Figure 1C:
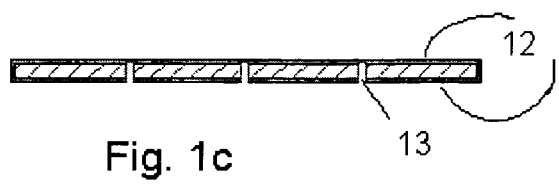
Figure 2C:
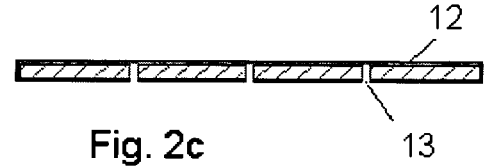
Figure 3A:
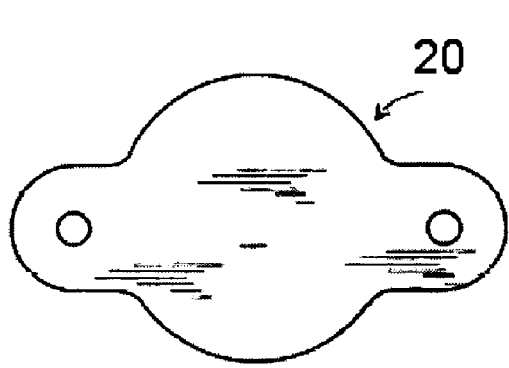
FIGS. 3(a) and 3(b) are plan views of one embodiment of the heater of the invention, viewed from the underside and the top of a heater fabricated from a solid graphite disk.
Figure 3B:
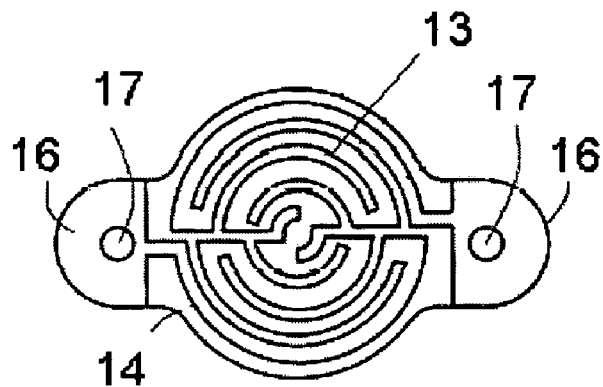

In one embodiment as illustrated in FIG. 1C or 2C, the coated graphite base 10 is machined from the side opposite the substantially continuous coated surface 12 into a desired electrical pattern for resistive heating. In one embodiment, the pattern 13 is that of a spiral or serpentine configuration as shown in FIG. 3B, with open ends adapted for connection to an external power supply.

Figure 1D:
Figure 2D:
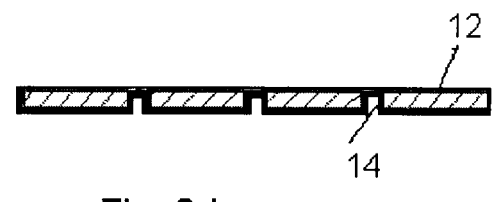

As illustrated in FIGS. 1D and 2D, the forming of the electrical pattern/the machining operation is conducted through the cross sectional body of the graphite base 10, up to the continuous coated surface 12. As shown, the machining is done without removing the coated layer 12, i.e., the coating is left substantially intact.

Coating the Patterned Graphite Body with a Substantially Continuous Overcoat: In this step, the patterned graphite body is coated with at least another layer for enhanced corrosion resistance against the wafer processing chemical environment. The protective overcoat layer 14 may cover both the top and the bottom surfaces of the patterned graphite body as illustrated in FIG. 1D, or the overcoating layer may simply provide a protective layer covering any exposed graphite as illustrated in FIG. 2D.

The outer coat may be of the same material, or of a different material from the first coating layer described in the previous sections. As with the first coating layer, the outer coat layer covering the patterned graphite body may comprise at least one of a nitride, carbide, carbonitride or oxynitride of elements selected from a group consisting of B, Al, Si, Ga, refractory hard metals, transition metals, and rare earth metals, or complexes and/or combinations thereof. In one embodiment, the outer coat layer comprises pBN, AlN, SiC, or SiN.

The overcoat layer 14 can be applied using the same techniques as with the first coating layer 12, or it can be applied using any other techniques known in the art as described in the previous sections, including but not limited to PVD, CVD, powder coating via thermal injection, thermal spraying, arc spraying, painting, and air spraying.

In one embodiment, the overcoat layer has a thickness of 0.005 to 0.20 inches. In another embodiment, from about 0.01 to 0.10 inches. In a third embodiment, the overcoat layer has a thickness of less than about 0.05 inches. In yet a fourth embodiment, the overcoat layer is a flat solid substantially continuous surface layer of pBN having a thickness in the range of about 0.01–0.03 inches.

In one embodiment wherein pBN is used for the overcoat layer, the layer thickness is optimized to promote thermal uniformity, taking into advantage the high degree of thermal conductivity anisotropy inherent in pBN. In yet another embodiment, multiple overcoat layers are employed, pBN as well as pyrolytic graphite, to promote thermal uniformity.

Figure 1E:
Figure 2E:

Forming Electrical Contacts. In this final step and as illustrated in FIGS. 1E or 2E, electrical contacts 15 are machined through the top coating layer to expose the graphite 10 at contact locations for connection to an external power source. Alternatively, electrical contact extensions can be machined into the graphite base 10 at the outset before the final coating process, or added prior to the over coating operation.

In one embodiment of the invention and at intermediate steps in the production process, graphite electrical extension posts can be connected to the serpentine electrical path 13 and coated with the over-coating materials. FIGS. 3A and 3B are plan views of one embodiment of a heater element 20 with tabs 16 extended from the coated graphite body, wherein the post connectors may be attached to the heating element 20 through holes 17 of tabs 16.

The heater of the Invention. The heater of the present invention may be used for different applications particularly semiconductor processing applications as a wafer carrier. It has been found that the mechanical strength of the heater of the present invention to be dramatically improved relative to the strength of a conventional graphite heater.

In semiconductor applications, wafers of different size and/or shape are typically processed. Therefore, it will be appreciated that The heater in the broad practice of the present invention, may be of any suitable size and shape/conformation, as required for the specific use or application envisioned. The heater may be of a cylindrical shape, a flat disk, a platen, and the like. It may have dimensions of about 2 to 20 inches in its longest dimension (e.g., diameter, length, etc.) and 0.05" to 0.50" inches thick. In one embodiment, it may be of a disk having a dimension of 2" long×2" wide×0.01" mm thick. In one embodiment of a cylinder, the heater has dimensions of 2" to 20" in inside diameter, 0.10" to 0.50" wall, and 2" to 40" long.

The electrical pattern as defined by the graphite body may be of various sizes and shapes for defining an electrical flow path for at least one zone of an electrical heating circuit. In one embodiment, the flow path is of a spiral or serpentine geometrical pattern. In a second embodiment, the flow path is a helical pattern. In a third embodiment, the path is of a spirally coiled pattern. In a fourth embodiment, the path is of a zigzag pattern. In a fifth embodiment, the flow path is a of continuous labyrinthine pattern. In another embodiment, the flow path is a randomly convoluted pattern. In yet another embodiment, the path is of a swirled pattern.

The surface of the heater of the invention is substantially continuous and coated with overcoat layer or layers without any exposed graphite surfaces for hermetically sealing the patterned heat-generating graphite resistor body, other than those surfaces necessary for electrical connections, thereby preventing short circuits and electrical changes from occurring, and insuring a substantially continuous surface free from graphite dust and particles. There are however, certain holes or surface features 15 on the top coated surface 14 of the heater, for the reason that in most practical wafer processing applications, these features may be required for lifting devices or mounting locations as illustrated in FIGS. 1E and 2E.

While the invention has been described with reference to a preferred embodiment, those skilled in the art will understand that various changes may be made and equivalents may be substituted for elements thereof without departing from the scope of the invention. In addition, many modifications may be made to adapt a particular situation or material to the teachings of the invention without departing from the essential scope thereof.

All citations referred herein are expressly incorporated herein by reference.

What is claimed is:

1. A heater comprising:
   a solid graphite body configured from a solid self standing body of graphite into a pattern for an electrical flow path defining at least one zone of an electrical heating circuit, said electrical circuit comprising terminal ends for terminals to be electrically connected to said electrical flow path, said graphite body having at least one heating surface,
   a coating layer encapsulating said patterned graphite body, said coating layer comprises at least one of a nitride, carbide, carbonitride or oxynitride of elements selected from a group consisting of B, Al, Si, Ga, refractory hard metals, transition metals, and rare earth metals, or complexes and/or combinations thereof; and
   a substantially continuous surface layer disposed on said heating surface, said surface layer comprising at least one of a nitride, carbide, carbonitride or oxynitride of elements selected from a group consisting of B, Al, Si, Ga, refractory hard metals, transition metals, and rare earth metals, or complexes and/or combinations thereof.

2. A heater comprising:
   a graphite body configured from a solid self standing body of graphite into a pattern for an electrical flow path defining at least one zone of an electrical heating circuit, said electrical circuit comprising terminal ends for terminals to be electrically connected to said electrical flow path,
   wherein a first coating layer is applied to at least one surface of said graphite body prior to being configured to form the electrical flow path pattern, said first coating layer comprising as least one of a nitride, carbide, carbonitride, or oxynitride of elements selected from a group consisting of B, Al, Si, Ga, refractory hard metals, transition metals, and rare earth metals, or complexes and/or combinations thereof;
   a second coating layer disposed on said patterned graphite body for a substantially continuous heating surface, said second coating layer comprising at least one of a nitride, carbide, carbonitride or oxynitride of elements selected from a group consisting of B, Al, Si, Ga, refractory hard metals, transition metals, and rare earth metals, or complexes and/or combinations thereof.

3. The heater of claim 2, wherein said first coating layer encapsulates the graphite body.

4. The heater of claim 2, wherein said second coating layer is applied onto the surface of the patterned graphite body that is not coated with the first coating layer, for a continuous heating surface.

5. The heater of claim 2, wherein said electrical flow path has at least one of a spiral pattern, a serpentine pattern, a helical pattern, a zigzag pattern, a continuous labyrinthine pattern, a spirally coiled pattern, a swirled pattern, a randomly convoluted pattern, and combinations thereof.

6. The heater of claim 2, wherein said coating layer and said second coating layer are the same material, selected from one of a nitride, carbide, carbonitride, or oxynitride of elements selected from a group consisting of B, Al, Si, Ga, refractory hard metals, transition metals, and rare earth metals, or complexes and combinations thereof.

7. The heater of claim 2, wherein said first coating layer comprises at least one of pyrolytic boron nitride, aluminum nitride, and complexes thereof.

8. The heater of claim 2, wherein said second coating layer comprises at least one of pyrolytic boron nitride, aluminum nitride, and complexes thereof.

9. The heater of claim 2, wherein said first coating layer and said second coating layer are formed by a technique selected from a physical vapor deposition, a chemical vapor deposition, a spraying process using an air sprayer, a painting process employing a roller, a thermal spray process, a thermal injection process, and combinations thereof.

10. The heater of claim 2, wherein said first coating layer and said second coating layer are deposited using the same technique.

11. The heater of claim 10, wherein said first coating layer and said second coating layer are deposited via a chemical vapor deposition process.

12. The heater of claim 2, wherein the pattern in said graphite body is configured using a technique selected from one of micro machining, micro-brading, laser cutting, chemical etching, and e-beam etching.

13. The heater of claim 2, wherein said graphite body is one of a disk, a platen, and a cylinder.

14. A method for forming a heater, said process comprising the steps of:
   a) providing a solid graphite body configured from a solid self standing body of graphite with at least one surface coated with a first coating layer comprising at least one of a nitride, carbide, carbonitride, or oxynitride of elements selected from a group consisting of B, Al, Si, Ga, refractory hard metals, transition metals, and rare earth metals, or complexes and/or combinations thereof;
   b) configuring a pattern for an electrical flow path defining at least one zone of an electrical heating circuit in said coated graphite heater;
   c) coating said patterned graphite heater with a second coating layer comprising at least one of a nitride, carbide, carbonitride, or oxynitride of elements selected from a group consisting of B, Al, Si, Ga, refractory hard metals, transition metals, and rare earth metals, or complexes and/or combinations thereof.

15. The method of claim 14, wherein said electrical circuit pattern comprises terminal ends for terminals to be electrically connected forming an electrical flow path.

16. The method of claim 14, wherein said first coating layer and said second coating layer are of the same material comprising at least one of a nitride, carbide, carbonitride or oxynitride of elements selected from a group consisting of B, Al, Si, Ga, refractory hard metals, transition metals, and rare earth metals, or complexes and/or combinations thereof.

17. The method of claim 14, wherein said electrical flow path has one of a spiral pattern, a serpentine pattern, a helical pattern, a zigzag pattern, a continuous labyrinthine pattern, a spirally coiled pattern, a swirled pattern, a randomly convoluted pattern, and combinations thereof.

18. The method of claim 14, wherein said first coating layer and said second coating layer are formed by a technique selected from a physical vapor deposition, a chemical vapor deposition, a spraying process using an air sprayer, a painting process employing a roller, a thermal spray process, a thermal injection process, and combinations thereof.

19. The method of claim 18, wherein said first coating layer and said second coating layer are formed via chemical vapor deposition.

20. The method of claim 14, wherein the pattern in said graphite body is configured using a technique selected from one of micro machining, micro-brading, laser cutting, chemical etching, and e-beam etching.

21. The method of claim 14, wherein said graphite body is one of a disk, a platen, and a cylinder.

22. The method of claim 14, further comprising the step of providing terminalends for terminals to be electrically connected to said electrical flow path.

* * * * *